United States Patent
Sano et al.

(10) Patent No.: US 6,472,765 B1
(45) Date of Patent: Oct. 29, 2002

(54) PLASTIC ENCAPSULATED SEMICONDUCTOR LIGHT EMITTING DEVICE WITH A COVER OF FLUORESCENT PARTICLES

(75) Inventors: Takeshi Sano, Niiza (JP); Hiroyuki Kawae, Niiza (JP)

(73) Assignee: Sanken Electric Co., Ltd., Saitama-pref. (JP)

(*) Notice: Subject to any disclaimer, the term of this patent is extended or adjusted under 35 U.S.C. 154(b) by 156 days.

(21) Appl. No.: 09/597,038

(22) Filed: Jun. 20, 2000

(51) Int. Cl.⁷ .................... H01L 23/28; H01L 33/00
(52) U.S. Cl. ................ 257/787; 257/99; 257/100; 257/98
(58) Field of Search .............. 257/98, 787, 88, 257/95, 99, 89; 438/22, 25, 26, 27, 29

(56) References Cited

U.S. PATENT DOCUMENTS 5,962,971 A * 10/1999 Chen .................... 313/512

6,340,824 B1 * 1/2002 Komoto et al. ............ 257/99

* cited by examiner

Primary Examiner—Olik Chaudhuri
Assistant Examiner—Hoa B. Trinh
(74) Attorney, Agent, or Firm—Bachman & LaPointe, P.C.

(57) ABSTRACT

A plastic encapsulated semiconductor light emitting device comprises a plurality of leads 1, 2, one of which is formed with a dished portion 5; a semiconductor light emitting element 3 attached on a bottom surface 6 of the dished portion 5 for electrical connection of the light emitting element across the plurality of leads 1, 2; a plastic encapsulant 9 for sealing each end of the leads 1, 2, and the semiconductor light emitting element 3; a light-permeating cover 20 attached to an outer surface of the plastic encapsulant 9; and fluorescent particles 16 contained in the cover 20. As the number of fluorescent particles 16 at the vertex of the upper portion 22 is larger than that of the fluorescent particles 16 in the cylindrical lower portion 21, the semiconductor light emitting device can emit light with the nearly uniform light wavelength at any angular distance from the central axis of the plastic encapslant 9.

8 Claims, 2 Drawing Sheets

PLASTIC ENCAPSULATED SEMICONDUCTOR LIGHT EMITTING DEVICE WITH A COVER OF FLUORESCENT PARTICLES

BACKGROUND OF THE INVENTION

1. Field of the Invention

The present invention relates to a semiconductor light emitting device having a plastic encapsulant, and more specifically, relates to a plastic encapsulated semiconductor light emitting device having a light emitting element and a light-permeating cover which can convert the wavelength of the light emitted from the light emitting element into a light of different wavelength to irradiate it outside of the cover.

2. Description of the Prior Art

A prior art semiconductor light emitting device as shown in FIG. 2 has a plurality of leads 1, 2 and a semiconductor light emitting element 3 secured with an adhesive agent such as solder (not shown) on a bottom surface 6 of a dished or cup-like portion (header) 5 formed at the end of the lead 1. A lead wire 4 is connected between an electrode formed on a top surface of the semiconductor light emitting element 3 and a metal post of the lead 2 for electrical connection. A plastic encapsulant 9 is formed by the well known transfer molding or casting method to seal each one end of the leads 1, 2, the semiconductor light emitting element 3 and the lead wire 4. The plastic encapsulant 9 comprises a sealing portion 10 formed into a substantially cylindrical shape, and a lens portion 11 formed into a substantially hemispherical shape integral with the sealing portion 10. The plastic encapsulant 9 mainly contains an epoxy resin or the like having a light permeability, and as required, some additives may be mixed in the epoxy resin such as a scattering agent such as silica or the like and a pigment of a certain non-light emitting substance, however, no fluorescent particle is added to the plastic encapsulant 9.

Attached to the plastic encapsulant 9 is a light-permeating cover 12 which comprises a lower portion 13 formed into a substantially cylindrical shape, and an upper portion 14 formed into a substantially hemispherical shape integral with the lower portion 13. The lower and upper portions 13, 14 have respectively their shapes matched to the sealing and lens portions 10, 11 of the plastic encapsulant 9. When the cover 12 is attached to the plastic encapsulant 9, the lens portion 11 is inserted into the opening 15 provided at one end of the lower portion 13 to fit the plastic encapsulant 9 in the cover 12 so that an inner surface of the cover 12 is in the close and tight contact with an outer surface of the plastic encapsulant 9. Therefore, the cover 12 attached to the encapsulant 9 does not easily come off out of the plastic encapsulant 9 although an external force such as vibration is applied to the cover 12.

When the semiconductor light emitting element 3 is electrically operated, it produces a light, a part of which is reflected on side surfaces of the dished portion 5 formed in the upper portion of the lead 1. However, the other part of the light is emitted from the top of the semiconductor light emitting element 3 without being reflected on the side surfaces of the dished portion 5. Both of these two lights are condensed or converged by the lens portion 11 of the plastic encapsulant 9 to irradiate it outside of the plastic encapsulant 9.

When the light emitting element 3 comprises for example a GaAlP, GaP or GaN semiconductor, it generates a light of red, green or blue color respectively. When the light emitting element 3 comprises a GaAs semiconductor, the semiconductor light emitting device emits infrared radiation. If no cover 12 is attached to the semiconductor light emitting device, the light projected from the plastic encapsulant 9 offers an extremely sharp directivity of emission light intensity around the tip of the lens portion 11 of the plastic encapsulant 9 with respect to angular distance from the central axis of the plastic encapsulant 9 as shown in FIG. 3 which exemplifies that the light is practically not radiated over the angular range of ±30 degrees. The color of the light emitted from this semiconductor light emitting device is determined by the inherent emission light wavelength of the semiconductor light emitting element 3.

On the other hand, when the cover 12 is attached to the plastic encapsulant 9, the light of the semiconductor light emitting element 3 passes through the plastic encapsulant 9, and then is radiated outside of the cover 12 with scattering of the light by the fluorescent particles 16 dispersed in the cover 12.

The fluorescent particles 16 refer to substances which absorb a light irradiated thereto, while radiate a light of the wavelength different from that of the absorbed light. Therefore, the light emitted from the cover 12 offers an extremely wide directivity of emission light intensity as shown in FIG. 4, and the scattered light is spread out to the entire angle range of ±90 degrees. Because the fluorescent particles 16 are excited by the light irradiated from the semiconductor light emitting element 3 through the plastic encapsulant 9, the fluorescent particles 16 radiate lights of the wavelength different from that of the light from the semiconductor light emitting element 3. A part of the light emitted from the semiconductor light emitting element 3 passes through an area of the light-permeating cover 12 without fluorescent particles 16 so that it is then directly irradiated outside of the cover 12 in the absence of excited fluorescent particles. Consequently, the unchanged light emitted from the semiconductor light emitting element 3 is mixed with the wavelength-converted light emitted from the fluorescent particles 16 to emit the light of the mixed color wavelengths outside of the cover 12.

In the prior art semiconductor light emitting device, the cover 12 has approximately uniform thickness in the whole area with neglect of the production errors and the uneven shrinkage of the plastic materials. The light from the semiconductor light emitting element 3 is intense at the tip of the lens portion 11 so that there is a large likelihood of the light component which does not impinge on the fluorescent particles 16 and passes through and outside of the cover 12 without the wavelength-conversion of the major component of emission light from the semiconductor light emitting element 3. On the other hand, only weak light from the semiconductor light emitting element 3 passes through the sealing portion 10 of the plastic encapsulant 9, and the major portion of the weak light impinges on the fluorescent particles 16 for wavelength-conversion. Therefore, when the cover 12 is applied to the plastic encapsulant 9 for the surface light emission indication with scattered light, wavelength of the light irradiated outwardly from the semiconductor light emitting device varies with the light emission angle with respect to a central axis of the plastic encapsulant 9 in the prior art semiconductor light emitting devices. Thus, for example, an undesirable problem arises that the emission light color changes depending upon the area of the light emitting surface so that the visible emission light does not have a specific, uniform and exact color. Obviously, this defect would give rise to bad impression to people that the semiconductor light emitting device is of poor quality.

Therefore, an object of the present invention is to provide a plastic encapsulated semiconductor light emitting device capable of emitting light with nearly uniform light wavelength at any angular distance from the central axis of the plastic encapsulant with a light-permeating cover attached thereon.

SUMMARY OF THE INVENTION

The plastic encapsulated semiconductor light emitting device according to the present invention comprises a plurality of leads 1, 2; at least one of which is formed with a dished portion 5; a semiconductor light emitting element 3 attached on the bottom surface of the dished portion 5 for electrical connection of the light emitting element 3 across the leads 1, 2; a plastic encapsulant 9 for sealing each one end of the leads 1, 2 and the semiconductor light emitting element 3; and a light-permeating cover 20 preferably removably attached to an outer surface of the plastic encapsulant 9 with fluorescent particles 16 contained in the cover 20. The plastic encapsulant 9 comprises a sealing portion 10 formed into a substantially cylindrical shape, and a lens portion 11 formed into a substantially hemispherical shape integral with the sealing portion 10. The cover 20 comprises a lower portion 21 formed into a substantially cylindrical shape matched to the sealing portion 10 of the plastic encapsulant 9, and an upper portion 22 formed into a substantially hemispherical shape integral with the lower portion 21 and matched to the lens portion 11 of the plastic encapsulant 9. A blue light irradiated from the semiconductor light emitting element 3 passes through the plastic encapsulant 9 and reaches the fluorescent particles 16 in the cover 20 to activate or excite the fluorescent particles 16 for wavelength-conversion of the light emitted from the semiconductor light emitting element 3. As a result, the fluorescent particles 16 generates a white light from the cover 20 with its wavelength different from that of the light from the semiconductor light emitting element 3. The number of the fluorescent particles 16 is greater in the upper portion 22 of the cover 20 than in the lower portion 21 to produce the substantially homogeneous white light from any outer surface of the cover 20.

As the semiconductor light emitting element 3 emits intense light of the extremely sharp directivity at the tip of the lens portion 11 of the plastic encapsulant 9, a greater number of fluorescent particles 16 are positioned in the cover 20 near the tip of the lens portion 11 of the plastic encapsulant 9 to increase the amount of light impinging on the fluorescent particles 16. Therefore, the amount of light impinging on the fluorescent particles 16 is substantially balanced to that of light permeating through the cover 20 but deviating from the fluorescent particles 16. The cover 20 includes a smaller number of fluorescent particles 16 in the vicinity of the sealing portion 10 of the plastic encapsulant 9 which receives the light of the lower intensity emitted from the semiconductor light emitting element 3. One part of the light emitted from the semiconductor light emitting element 3 deviates from and does not impinge on the fluorescent particles 16 and passes through the cover 20 to irradiate the wavelength-unchanged light. The other part of the light emitted from the semiconductor light emitting element 3 impinges on and excite the fluorescent particles 16 to generate the wavelength-converted light, and then, there would be substantially constant ratio of the amount of the wavelength-converted light to the amount of the unchanged light. Accordingly, the semiconductor light emitting device can emit light with the nearly uniform wavelength at any angular distance from the central axis of the semiconductor light emitting device.

In an embodiment of the present invention, the dished portion 5 has inclined side surfaces 7 for surrounding the bottom surface 6. The thickness of the cover 20 is the greatest at the vertex of the upper portion 22, and is gradually reduced toward the lower portion 21 so that the thickness of the cover 20 in the upper portion 22 is greater than the thickness of the lower portion 21.

DESCRIPTION OF THE PREFERRED EMBODIMENTS

Figure 1:
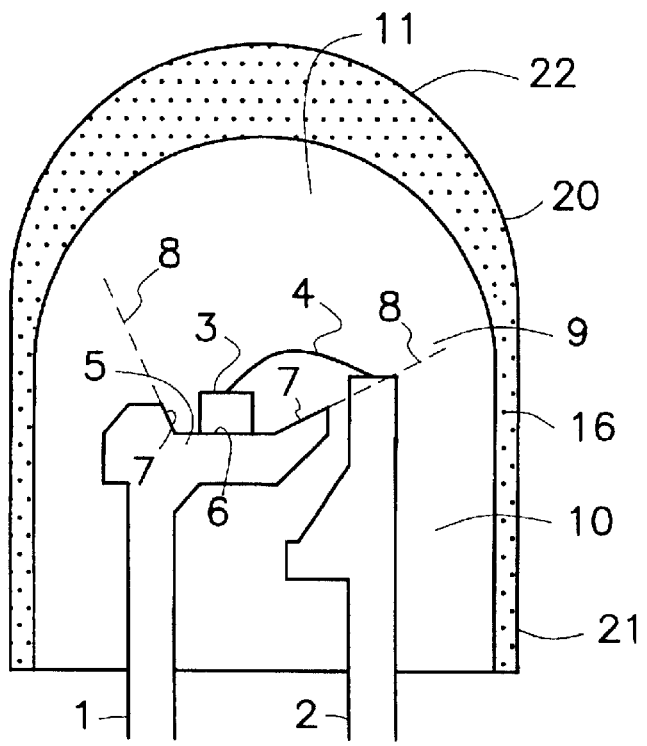
FIG. 1 is a sectional view of a plastic encapsulated semiconductor light emitting device with a light-permeating cover according to the present invention.
Figure 2:
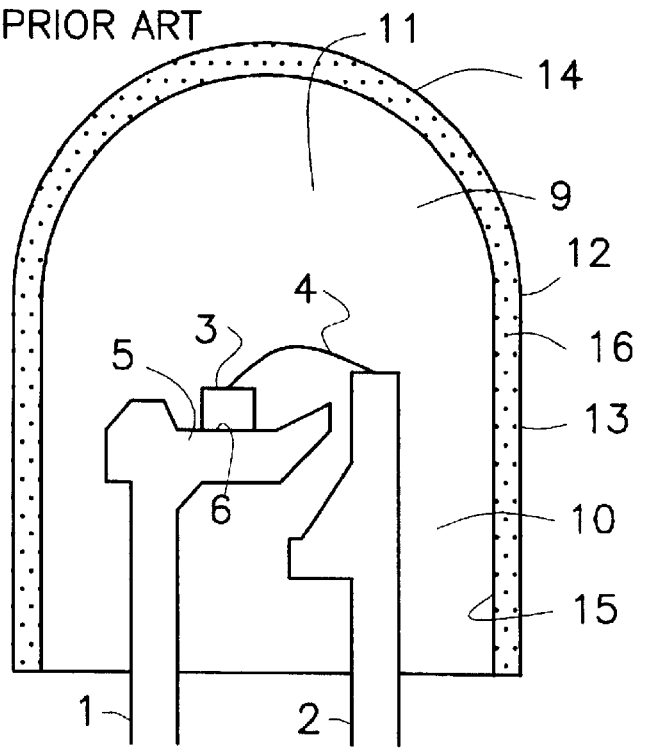
FIG. 2 is a sectional view of a prior art plastic encapsulated semiconductor light emitting device with a light-permeating cover.

An embodiment of the plastic encapsulated semiconductor light emitting device according to the present invention is described hereinafter with reference to FIG. 1 showing a light-permeating cover attached to the light emitting device. Same reference numerals are applied to same or similar portions in FIG. 1 as those shown in FIG. 2 with omission of the description on these portions hereinafter.

As shown in FIG. 1, the plastic encapsulated semiconductor light emitting device according to the present invention comprises a light-permeating cover 20 attached to an outer surface of the plastic encapsulant 9. The cover 20 comprises a light-permeating plastic substrate which contains the fluorescent particles 16 for wavelength-conversion of the light emitted from the semiconductor light emitting element 3 due to the excitation of the fluorescent particles 16. In this case, no fluorescent particles are added to the plastic encapsulant 9 to prevent scattering of light in the plastic encapsulant 9 by the fluorescent particles. The plastic substrate is formed of resinous material selected from polyester resin, acrylic resin, urethane, nylon, silicone resin, vinyl chloride, polystyrol, Bakelite, and CR 39 (acrylic glycol carbonate resin). The urethane, nylon and silicone resin provide a desirable elasticity for the cover 20 to facilitate attachment of the cover 20 to the plastic encapsulant 9 for tight fit.

The cover 20 comprises a lower portion 21 formed into a substantially cylindrical shape matched to the sealing portion 10 of the plastic encapsulant 9, and an upper portion 22 formed into a substantially hemispherical shape integral with the lower portion 21 and matched to the lens portion 11 of the plastic encapsulant 9. One of the most important features of this invention is that the thickness of the cover 20 is the greatest at the vertex of the upper portion 22, and is continuously decreased toward the lower portion 21. The cover 20 has its uniform thickness from a lower end of the upper portion 22 to the lower portion 21.

The lead 1 is formed with inclined side surfaces 7 in the dished portion 5 for surrounding the bottom surface 6 to define imaginary planes 8 extended from the side surfaces 7 of the dished portion 5. The vertex of the upper portion 22 in the cover 20 is disposed inside of imaginary planes 8 extended from the side surfaces 7 of the dished portion 5. The upper portion 22 has its thicker top portion disposed over the dished portion 5, and the thickness of the cover 20 in the upper portion 22 is greater than the thickness of the lower portion 21. If the fluorescent particles 16 are distributed or dispersed in any areas of the cover 20 at a constant density, the number of fluorescent particles 16 along the thickness direction of the cover 20 is the maximum at the vertex of the upper portion 22, and is gradually reduced toward the lower portion 21. In other words, the number of the fluorescent particles 16 is relatively larger in the area of the upper portion 22 contained within the imaginary planes 8. To the contrary, the number of the fluorescent particles 16 is relatively smaller in the lower portion 21 outside of the imaginary planes 8.

In the embodiment, the added fluorescent particles 16 are excited by light having a wavelength of approximately 430 to 480 nm to generate a light with the wavelength of approximately 500 to 600 nm. The fluorescent particles 16 dispersed in the cover 20 comprise a basic material of zinc sulfide and cadmium sulfide, an activator of copper and a fusing agent of barium chloride and potassium chloride. Various kinds of the fluorescent particles 16 may be used for the excitation with light of the relatively short wavelength to emit light of the relatively long wavelength or for the excitation with light of the relatively long wavelength to emit light of the relatively short wavelength. In the latter case, the semiconductor light emitting device would generate a luminous color of the relatively short wavelength with the semiconductor light emitting element 3 for producing a light of the long wavelength.

The basic material may be selected from inorganic fluorescent particles, such as oxides, sulfides, silicates, aluminates, vanadates and the like of such substances as zinc, cadmium, magnesium, silicon, yttrium, and other rare earth elements, or organic fluorescent particles, such as fluorescein, eosin, oils or mineral oils and mixture thereof. Copper, iron, and nickel are not suitable for the basic material.

Added to the basic material is the activator with the small amount between 0.001 weight % through a few weight percents. The activator may be of a material selected from silver, copper, manganese, chromium, europium, cerium, gadolinium, zinc, aluminum, lead, phosphorus, arsenic, gold and mixture thereof. The fusing agent preferably includes a material selected from sodium chloride, potassium chloride, magnesium carbonate, barium chloride and mixture thereof. The cover 20 is formed by plastic molding, spraying or applying on the plastic encapsulant 9 a liquid plastic material containing fluorescent particles, and curing same. An adhesive may be filled in a gap between the plastic encapsulant 9 and the cover 20 to eliminate formation of air gaps between the plastic encapsulant 9 and the cover 20 for improvement of the light emission efficiency. The density of the fluorescent particles 16 is higher in the upper portion 22 of the cover 20 than in the lower portion 21 because for example the density of the fluorescent particles 16 may be gradually increased from the lower portion 21 to the upper portion 22. The cover 20 may have its uniform thickness from a lower end of the upper portion 22 to the lower portion 21.

In the semiconductor light emitting device according to the present invention as shown in FIG. 1, the semiconductor light emitting element 3 may comprise a GaN semiconductor for emitting blue light of the emission peak at approximately 430 to 480 nm, and the blue light is irradiated onto the fluorescent particles 16 in the cover 20 through the plastic encapsulant 9 to activate the fluorescent particles 16. Therefore, the wavelength of the blue light is converted by the fluorescent particles 16 in the cover 20 into white light of the emission peak wavelength at approximately 500 to 600 nm so that the white light is finally emitted outside of the cover 20.

The cover 20 can be easily formed by injection-molding molten resin containing fluorescent particles into a desired shape, and then attaching the molded cover 20 to the plastic encapsulant 9. Otherwise, the cover 20 can be made by directly spraying or applying a liquid plastic material containing fluorescent particles to form a film onto the plastic encapsulant 9. The film is then cured to prevent formation of air gaps between the plastic encapsulant 9 and the cover 20.

Figure 3:
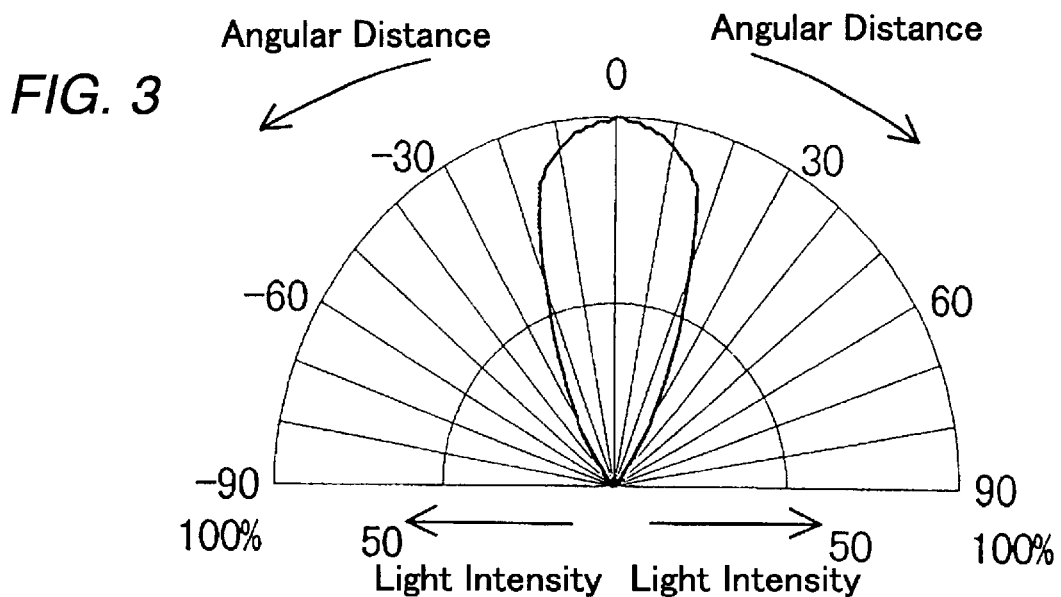
FIG. 3 is a graph showing a light intensity property with the angular distance from the central axis of a plastic encapsulated semiconductor light emitting device; and, FIG. 4 is a graph showing a light intensity property with the angular distance from a central axis of the plastic encapsulated semiconductor light emitting device equipped with a light-permeating cover.
Figure 4:
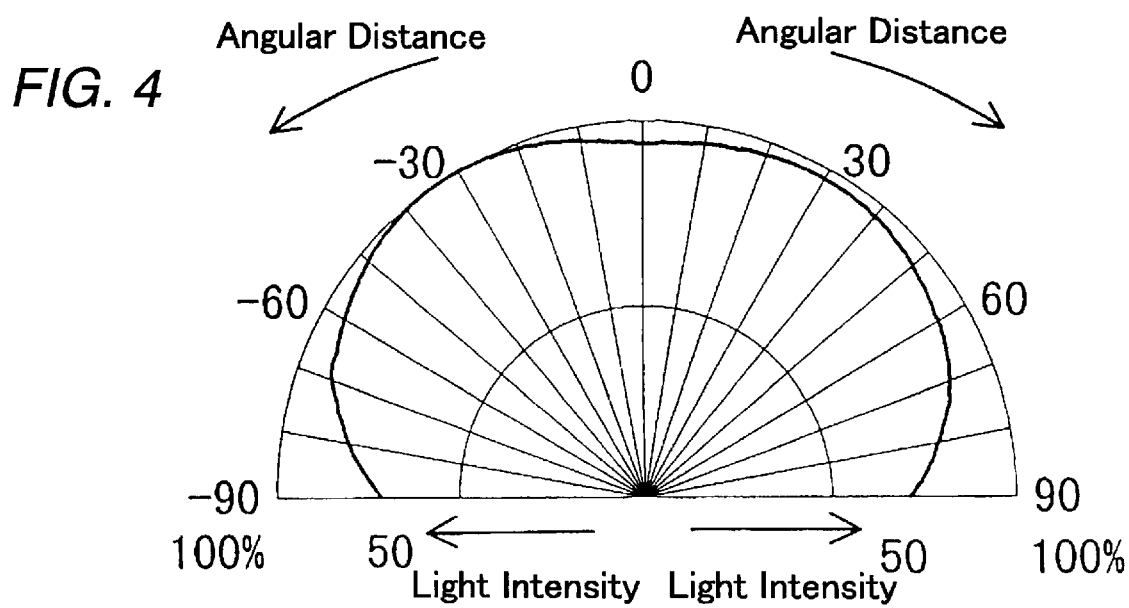

In operation, a blue light irradiated from the semiconductor light emitting element 3 passes through the plastic encapsulant 9 and reaches the fluorescent particles 16 in the cover 20 to activate the fluorescent particles 16 which therefore generate a white light from the cover 20 with its wavelength different from that of the light from the semiconductor light emitting element. The number of the fluorescent particles 16 in the upper portion 22 of the cover 20 is greater than that of the fluorescent particles 16 in the lower portion 21. The semiconductor light emitting element 3 emits intense light of the extremely sharp directivity at the tip of the lens portion 11 of the plastic encapsulant 9 as shown in FIG. 3 to increase the amount of light impinging on the fluorescent particles 16 because a greater number of fluorescent particles 16 are positioned in the cover 20 near the tip of the lens portion 11 of the plastic encapsulant 9. Therefore, the amount of light impinging on the fluorescent particles 16 is substantially balanced to that of light permeating through the cover 20 without impinging on the fluorescent particles 16. The cover 20 includes a smaller number of fluorescent particles 16 in the vicinity of the cylindrical sealing portion 10 of the plastic encapsulant 9 which receives the light projected by the semiconductor light emitting element 3 with the lower light intensity. While one part of the light emitted from the semiconductor light emitting element 3 does not impinge on the fluorescent particles 16 and permeates through the cover 20 to irradiate the wavelength-unchanged light, the other part of the light emitted from the semiconductor light emitting element 3 impinges on and excite the fluorescent particles 16 to generate the wavelength-converted light, there would be substantially constant ratio of the amount of the wavelength-converted light to the amount of the unchanged light.

Accordingly, the semiconductor light emitting device can emit light with the nearly uniform light wavelength at any angular distance from the central axis of the semiconductor light emitting device.

Accordingly, this embodiment can accomplish the following functional effects:

(1) No light scattering is performed in the plastic encapsulant 9 which does not contain fluorescent particles although the fluorescent particles 16 are contained in the cover 20.

(2) The cover 20 can realize the emission of the light with the wavelength different from that of the light generated from a commercially available semiconductor light emitting element 3.

(3) The cover 20 can be easily replaced to emit a light of the different wavelength or a desired color.

(4) A desired mixed light or half tone light can be taken out by blending fluorescent particles 16 of plural types in the varied mixture ratio in the cover 20.

(5) The cover 20 attached with a tight fit to the plastic encapsulant 9 does not easily come out of the plastic encapsulant 9 although an external force such as vibrations is applied to the cover 20.

(6) The semiconductor light emitting devices can be manufactured at low cost because the cover 20 can be attached to a commercially available semiconductor light emitting devices with the plastic encapsulant 9.

The above-mentioned embodiment of the present invention can be altered in various ways. In the above example, the cover 20 is designed to have the greatest thickness at the vertex of the upper portion 22 so that the thickness is gradually reduced toward the lower portion 21. Alternatively, the cover 20 can be formed with the uniform thickness from the upper portion 22 to the lower portion 21 with the density of fluorescent particles 16 gradually increasing from the lower portion 21 to the upper portion 22 in the cover 20 so that the density of fluorescent particles 16 is higher in the upper portion 22 than in the lower portion 21. To this end, a light-permeating cover 20 can be formed for example by injecting molten resin containing the fluorescent particles 16 into a cavity of a mold, and then rotating the plastic molding with the largest revolution radius to the vertex of the upper portion 22. In this case, the larger fluorescent particles 16 are moved outwardly toward the vertex of the upper portion 22 by the centrifugal force, while the smaller fluorescent particles 16 remain in the lower portion 21. Therefore, if the cover 20 is formed with the uniform thickness everywhere, the fluorescent particles 16 can be positioned in the cover 20 with the density of the particles 16 gradually increased from the lower portion 21 toward the vertex of the upper portion 22, thus with the higher density in the upper portion 22 and with the lower density in lower portion 21. Otherwise, the cover 20 may be formed by injecting molten resin containing the fluorescent particles 16 into the cavity in a mold, and then retaining the mold in the condition of keeping the vertex of the upper portion 22 down so that the fluorescent particles 16 moves downwardly by the gravity toward the vertex of the upper portion 22 to gradually increase the density of fluorescent particles 16 toward the vertex of the upper portion 22.

As stated above, the semiconductor light emitting device according to the present invention is very advantageous since it can emit a light with the nearly uniform light wavelength at any angular distance from the central axis of the plastic encapslant, and also it can produce a light of a substantially specific and uniform emission light color on the whole light

What is claimed is:

1. A plastic encapsulated semiconductor light emitting device comprising a plurality of leads, at least one of which is formed with a dished portion; a semiconductor light emitting element having a central axis in electrical connection across said leads and attached on a bottom surface of said dished portion; a plastic encapsulant for sealing each one end of said leads and said semiconductor light emitting element; and a light-permeating cover removably attached to an outer surface of said plastic encapsulant for enclosing said light emitting element, said cover containing fluorescent particles (16) dispersed therein;

said plastic encapsulant comprising a sealing portion formed into a substantially cylindrical shape, and a lens portion formed into a substantially hemispherical shape integral with the sealing portion; said cover comprising a lower portion formed into a substantially cylindrical shape matched to the sealing portion of said plastic encapsulant wherein the lower portion is of substantially uniform thickness, and an upper portion formed into a substantially hemispherical shape integral with said lower portion and matched to the lens portion of said plastic encapsulant;

wherein a light irradiated from said semiconductor light emitting element passes through said plastic encapsulant and reaches the fluorescent particles in said cover to activate the fluorescent particles which therefore generate light from said cover with the wavelength different from that of the light from said semiconductor light emitting element;

said dished portion has inclined side surfaces for surrounding said bottom surface; the upper portion of said cover is disposed inside of imaginary planes extended from the side surfaces of said dished portion; and said upper portion of said cover has a thickness which is greater than the substantially uniform thickness of said lower portion so that the number of the fluorescent particles in the upper portion of said cover is greater than that in said lower portion, wherein said semiconductor light emitting element device emits a substantially uniform wavelength light through said cover at any angular distance from the central axis thereof.

2. A plastic encapsulated semiconductor light emitting device of claim 1, wherein said upper portion is disposed over said dished portion.

3. A plastic encapsulated semiconductor light emitting device of claim 1, wherein a vertex of the upper portion in said cover is disposed inside of imaginary planes extended from the side surfaces of said dished portion; the thickness of said cover is greatest at the vertex of said upper portion, and is gradually reduced toward said lower portion.

4. A plastic encapsulated semiconductor light emitting device of claim 1, wherein said cover comprises a light-permeating plastic substrate which contains said fluorescent particles; said plastic substrate is formed of resinous material selected from polyester resin, acrylic resin, urethane, nylon, silicone resin, vinyl chloride, polystyrol, Bakelite, CR 39 (acrylic gylcol carbonate resin) and mixture thereof; said fluorescent particles comprises a basic material, an activator and a fusing agent; said basic material is selected from inorganic fluorescent particles, such as oxides, sulfides, silicates, aluminates, vanadates and the like of such substances as zinc, cadmium, magnesium, silicon yttrium, and rare earth elements, or organic fluorescent particles, such as fluorescent, eosin, oils or mineral oils and mixture thereof; said activator is selected from silver, copper, manganese, chromium, europium, cerium, gadolinium, zinc, aluminum, lead, phosphorus, arsenic and gold; and said fusing agent is selected from sodium chloride, potassium chloride, magnesium carbonate and barium chloride.

5. A plastic encapsulated semiconductor light emitting device comprising a plurality of leads, at least one of which is formed with a dished portion; a semiconductor light emitting element having a central axis in electrical connection across said leads and attached on a bottom surface of said dished portion; a plastic encapsulant for sealing each one end of said leads and said semiconductor light emitting element; and a light-permeating cover removably attached to an outer surface of said plastic encapsulant for enclosing said light emitting element, said cover containing fluorescent particles dispersed therein;

said plastic encapsulant comprising a sealing portion formed into a substantially cylindrical shape, and a lens portion formed into a substantially hemispherical shape integral with the sealing portion; said cover comprising a lower portion formed into a substantially cylindrical shape matched to the sealing portion of said plastic encapsulant wherein the lower portion is of substantially uniform thickness, and an upper portion formed into a substantially hemispherical shape integral with said lower portion and matched to the lens portion of said plastic encapsulant; and said semiconductor light emitting element emits a light which passes through said plastic encapsulant and reaches the fluorescent particles in said cover to activate the fluorescent particles which therefore generate light from said cover with the wavelength different from that of the light from said semiconductor light emitting element; said upper portion of the cover has higher density of said fluorescent particles than that of said fluorescent particles in said lower portion so that the number of fluorescent particles is greater in the upper portion of said cover than in said lower portion, wherein said semiconductor light emitting element device emits a substantially uniform wavelength light through said cover at any angular distance from the central axis thereof.

6. A plastic encapsulated semiconductor light emitting device of claim 5, wherein said cover has uniform thickness from a lower end of said upper portion to said lower portion.

7. A plastic encapsulated semiconductor light emitting device of claim 5, wherein the density of said fluorescent particles is gradually increased from said lower portion to said upper portion.

8. A plastic encapsulated semiconductor light emitting device of claim 5, wherein said cover comprises a light-permeating plastic substrate which contains said fluorescent particles; said plastic substrate is formed of resinous material selected from polyester resin, acrylic resin, urethane, nylon, silicone resin, vinyl chloride, polystyrol, Bakelite, CR 39 (acrylic glycol carbonate resin) and mixture thereof; said fluorescent particles comprises a basic material, an activator and a fusing agent; said basic material is selected from inorganic fluorescent particles, such as oxides, sulfides, silicates, aluminates, vanadates and the like of such substances as zinc, cadmium, magnesium, silicon, yttrium, and rare earth elements, or organic fluorescent particles, such as fluorescent, eosin, oils or mineral oils and mixture thereof; said activator is selected from silver, copper, manganese, chromium, europium, cerium, gadolinium, zinc, aluminum, lead, phosphorus, arsenic and gold; and said fusing agent is selected from sodium chloride, potassium chloride, magnesium carbonate and barium chloride.

\* \* \* \* \*